(12) United States Patent
McMullen

(10) Patent No.: US 8,270,130 B1
(45) Date of Patent: Sep. 18, 2012

(54) DEVICE FOR SENSING THE FUNCTIONING OF AN ELECTRICALLY POWERED DEVICE

(76) Inventor: Joseph E McMullen, Greenville, SC (US)

(*) Notice: Subject to any disclaimer, the term of this patent is extended or adjusted under 35 U.S.C. 154(b) by 318 days.

(21) Appl. No.: 12/799,895

(22) Filed: May 4, 2010

Related U.S. Application Data

(60) Provisional application No. 61/215,385, filed on May 5, 2009.

(51) Int. Cl.
*H02H 5/04* (2006.01)

(52) U.S. Cl. ............. 361/31; 361/23; 307/26; 307/29; 324/126; 324/127

(58) Field of Classification Search ............ 361/23, 361/30, 31; 318/430–434; 324/126, 127; 307/26, 29

See application file for complete search history.

(56) References Cited

U.S. PATENT DOCUMENTS

| | | | | |
|---|---|---|---|---|
| 5,349,289 | A  * | 9/1994  | Shirai | 324/127 |
| 6,456,060 | B1 * | 9/2002  | Wiesemann | 324/127 |
| 7,944,197 | B2 * | 5/2011  | Shah et al. | 324/115 |
| 8,120,350 | B2 * | 2/2012  | Shah et al. | 324/126 |
| 2010/0134094 | A1 * | 6/2010  | Shah et al. | 324/126 |
| 2010/0148756 | A1 * | 6/2010  | Shah et al. | 324/126 |
| 2010/0259101 | A1 * | 10/2010 | Micallef et al. | 307/26 |
| 2011/0069481 | A1 * | 3/2011  | Chen | 362/191 |
| 2012/0001768 | A1 * | 1/2012  | Radosavljevic et al. | 340/870.03 |

* cited by examiner

*Primary Examiner* — Paul Ip
(74) *Attorney, Agent, or Firm* — Metz Lewis Brodman Must O'Keefe LLC

(57) ABSTRACT

An electrical monitoring device for monitoring an electrically powered device is provided. The monitoring device includes a frame for placement onto a conductor of the electrically powered device. A sensor is present for detecting the amount of current passing through the conductor. Also, a display may be provided for indicating to the user parameters of the electrically powered device that are indicative of the current passing through the conductor.

15 Claims, 3 Drawing Sheets

DEVICE FOR SENSING THE FUNCTIONING OF AN ELECTRICALLY POWERED DEVICE

CROSS-REFERENCE TO RELATED APPLICATIONS

This application claims the benefit of U.S. Application Ser. No. 61/215,385 filed on May 5, 2009 and entitled, "Device for Sensing the Functioning of an Electrically Powered Device." U.S. Application Ser. No. 61/215,385 is incorporated by reference herein in its entirety for all purposes.

FIELD OF THE INVENTION

The present invention relates generally to a device for sensing and displaying properties associated with the functioning of electrically powered devices. More particularly, the present application involves a device for sensing the total operating time, peak current, and average current of an electrically powered device.

BACKGROUND

Preventative periodic maintenance is necessary to ensure that electrical powered devices operate efficiently and do not break down at inopportune moments. In this regard, the amount of operating time the electrical powered device is run may be indicative of the remaining life left in one or more components of the device. Also, the number of times the electrical device has been started or stopped may be indicative of the wear on the device. Current practice with respect to preventative maintenance is to service the electrical powered device according to a period of time. Such service may be inaccurately or inappropriately performed if the electrical powered device is run with greater or lesser frequency that average in a particular period of time.

Further, the diagnosis of problems associated with certain electrical powered devices may be difficult due to a lack of information available to the service personnel. As the source of the problem cannot be ascertained, the service personnel may be forced to replace entire components of the electrical powered device to make a particular repair. Such a repair may be ineffective and costly since properly functioning components of the electrical powered device are removed and replaced. Also, without knowledge of the source of the problem the problem cannot be eliminated thus possibly requiring a subsequent future repair. As such, there remains room for variation and improvement within the art.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended FIGS. in which.

Figure 1:
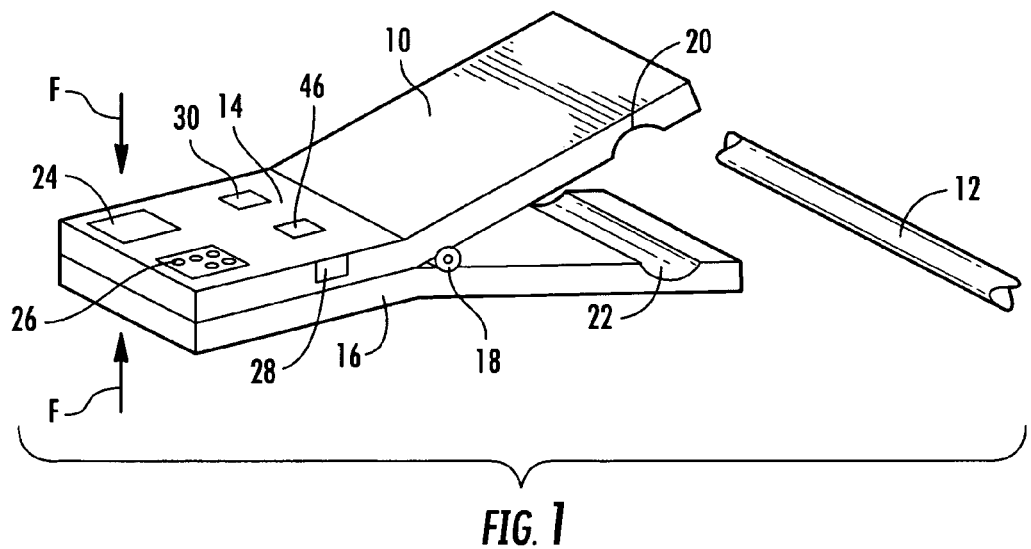
FIG. 1 is a perspective view of an electrical monitoring device unattached to an electrical conductor in accordance with one exemplary embodiment.

Repeat use of reference characters in the present specification and drawings is intended to represent the same or analogous features or elements of the invention.

DETAILED DESCRIPTION OF REPRESENTATIVE EMBODIMENTS

Reference will now be made in detail to embodiments of the invention, one or more examples of which are illustrated in the drawings. Each example is provided by way of explanation of the invention, and not meant as a limitation of the invention. For example, features illustrated or described as part of one embodiment can be used with another embodiment to yield still a third embodiment. It is intended that the present invention include these and other modifications and variations.

It is to be understood that the ranges mentioned herein include all ranges located within the prescribed range. As such, all ranges mentioned herein include all sub-ranges included in the mentioned ranges. For instance, a range from 100-200 also includes ranges from 110-150, 170-190, and 153-162. Further, all limits mentioned herein include all other limits included in the mentioned limits. For instance, a limit of up to 7 also includes a limit of up to 5, up to 3, and up to 4.5.

The present invention provides for an electrical monitoring device 10 that is capable of monitoring the functioning of an electrically powered device 61. The device 10 may be provided so that an electrical connection to the electrically powered device need not be made. In this regard, the device 10 may be attached to a conductor 12 of the electrically powered device 61 through the use of a simple clothes-pin like attachment mechanism of the device 10. The device 10 may be capable of measuring current flowing through the conductor 12 so that various properties of the electrically powered device 61 may be deduced. For example, the device 10 can be used to ascertain the total operating time, average operating time, number of start/stop events, peak current and average current imparted to the electrically powered device 61. This information may be helpful to service personnel repairing or performing routine maintenance on the electrically powered device 61. The aforementioned five parameters may be the only parameters calculated and/or displayed by the device 10, or in other arrangements additional or different parameters may be displayed and/or calculated.

FIG. 1 illustrates an electrical monitoring device 10 in accordance with one exemplary embodiment. Here, the electrical monitoring device 10 is arranged in a clothespin like design so as to include a first half 14 and a second half 16 that are placed into pivotal engagement with one another through the use of a spring 18. As shown forces F are applied by a user in order to move the portions of the first half 14 and second half 16 to the right of the spring 18 apart from one another and to draw the portions of the halves 14 and 16 to the left of the spring 18 into engagement with one another. The user may move the device 10 into the proximity of a conductor 12 of an electrically powered device 61. The electrically powered device 61 that is to be monitored may be any type of electrically powered device 61. For example, the electrically powered device 61 may be an AC powered appliance, a primary mover, an intermittent power consumer, a lighting fixture, a refrigerator, or a DC motor in accordance with various exemplary embodiments.

Figure 2:
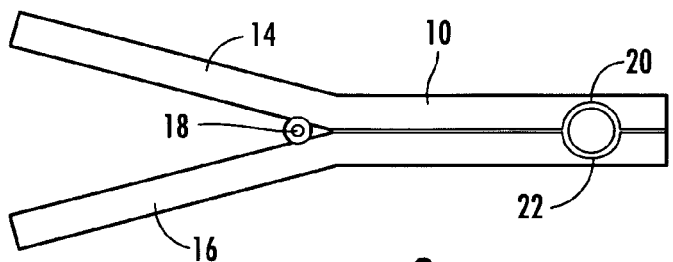
FIG. 2 is a side view of the electrical monitoring device of FIG. 1 shown attached to the electrical conductor.

The first half 14 may be provided with a recess 20 that can align with a corresponding recess 22 present on the second half 16. The user may position the device 10 close to the conductor 12 and remove forces F so that the recesses 20 and 22 engage the conductor 12 as shown in FIG. 2. It is to be understood that the recesses 20 and 22 need not be present in other versions of the electrical monitoring device 10. Complete removal of the forces F causes the device 10 to be retained onto the conductor 12 as the spring 18 biases the portions of the first half 14 and second half 16 that include the recesses 20 and 22 towards one another. Removal of the forces F thus causes the device 10 to be retained onto the conductor 12. The forces F may be reapplied to cause the device 10 to be removed from the conductor 12 as desired.

Figure 6:
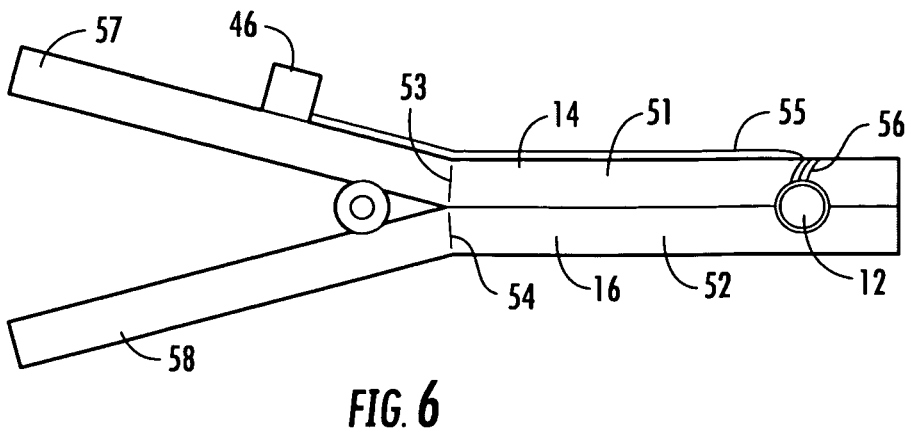
FIG. 6 is a side view of an electrical monitoring device in accordance with another exemplary embodiment.

The device 10 is arranged so as to be capable of measuring the amount of current that flows through the conductor 12 and thus measures the amount of current drawn by the electrically powered device 61. The device 10 may measure the current through any suitable means. Referring now to FIG. 6, for example, the device 10 can be constructed so as to be an inductive (transformer based) current sensor. In this arrangement, the conductor 12 functions as the primary of the transformer and secondary windings 56 are present and are wrapped around a forward portion 51 of the first half 14. The core of the transformer is arranged as the portions of the first half 14 and second half 16 of the device 10. Specifically, in one embodiment, the forward portion 51 and the forward portion 52, of the second half 16, form the core of the transformer when they are brought into engagement with one another upon closing of the device 10. The conductor 12 passes through the core that magnifies the conductor's 12 magnetic field. The forward portions 51 and 52 may each be a laminated structure and composed of various metal plates with insulation in certain exemplary embodiments. The conductor 12 may be insulated so that it is not in direct electrical contact with the secondary windings 56. AC current in the system is alternating changed from negative to positive, and the expanding and collapsing magnetic field creates current in the windings 56. This current is converted to a signal indicative of the current transmitted through the conductor 12. The current may be transferred through line 55 to sensor 46. Alternatively, the current can be transferred directly to the microcontroller 30 for sensing and interpretation. All of the necessary circuitry and components for performing the inductive current sensing may be included in the device 10. With such an arrangement, the monitoring is performed without connecting the conductor 12 to the device other than by way of simply clamping the device 10 thereon. All of the components and circuitry necessary for such a measurement may be included in the device 10. In this regard, wires, coil, magnets, chips, or any other component necessary to effect measurement of the current can be located in or on any portion of the first half 14, second half 16, recess 20, or recess 22.

Figure 7:
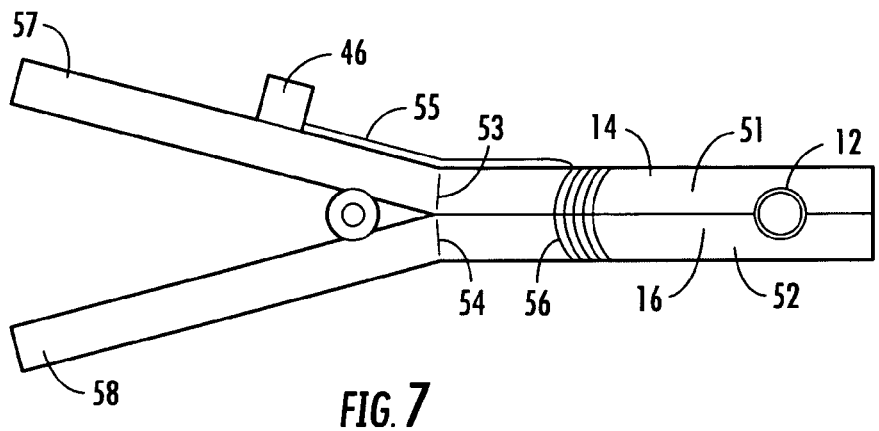
FIG. 7 is a side view of an electrical monitoring device in accordance with a different exemplary embodiment.

The device 10 can be modified so that the secondary windings 56 are not located at and within the recess 20, but rather some distance remote from the recesses 20 and 22. As shown in FIG. 7, the secondary windings 56 may be located between the recesses 20 and 22 and the reference lines 53 and 54. Reference line 53 separates the handle portion 57 of the first half 14 from the forward portion 51 of the first half 14. Reference line 54 separates the handle portion 58 of the second half 16 from the forward portion 52 of the second half 16. The forward portions 51 and 52 may be those portions of the first half 14 and second half 16 that engage one another upon closing of the device 10. The secondary windings 56 are located around both the forward portion 51 and the forward portion 52 so that a stronger signal may potentially be generated during use. The user may clamp the conductor 12 first, and then subsequently wrap the secondary windings 56 around both the first half 14 and the second half 16 before making the desired readings. It is to be understood that the secondary windings 56 can be variously located in accordance with other exemplary embodiments. For example, the secondary windings 56 may be located distal of the recesses 20 and 22 in other embodiments so that the secondary windings are located between the recesses 20 and 22 and the distal tips of the forward portions 51 and 52. The sensor 46 can be incorporated into the microcontroller 30 and/or may be composed of a number of components such as the secondary windings 56, forward potion 51, forward portion 52, and/or electrical lines directing the current. As such, the sensor 46 may be variously configured and is to be construed broadly herein as any component or arrangement of components capable of detecting and measuring current.

An additional mechanism of measuring the current in the conductor 12 may be through the use of a hall effect sensor that can be incorporated into the device 10. The device 10 forms a magnetically permeable core through which the conductor 12 passes. The magnetically permeable core concentrates the magnetic field generated by the conductor 12. A constant current causes the hall effect sensor to become energized and when subjected to a magnetic field create a voltage that can be measured. In this manner, the current imparted through the conductor 12 can be ascertained. All of the circuitry and components necessary for forming a hall effect sensor may be included in the device 10. Again, the conductor 12 need not be physically incorporated into the device 10 aside from simply clipping the device 10 onto the conductor 12.

Figure 4:
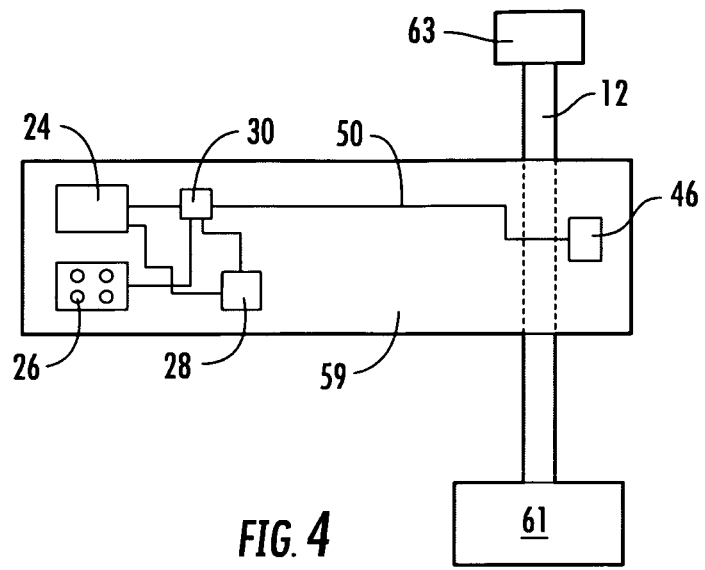
FIG. 4 is a top view of an electrical monitoring device in accordance with one exemplary embodiment.
Figure 5:
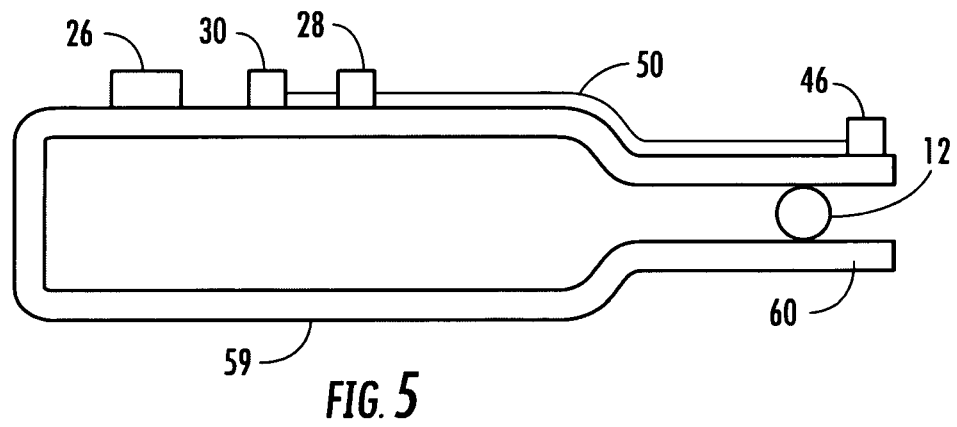
FIG. 5 is a side view of the electrical monitoring device of FIG. 4.

The hall effect sensor may be sensor 46 in FIGS. 1, 2, 4 and 5. With reference now to FIGS. 4 and 5, the sensor 46 may be a hall effect sensor and can be located distally to the conductor 12. The device 10 is not hinged and instead has a frame 59 that includes a prong section 60. The conductor 12 can be inserted into the prong section 60 and may be retained therein by a frictional engagement. The prong section 60 may be somewhat flexible so that it may bend upon insertion of the conductor 12 to more thoroughly secure the conductor 12. The hall effect sensor 46 can detect the current through the conductor 12 and communicate a signal through line 50 to the microcontroller 30.

When the electrically powered device 61 employs a DC motor, the inductive based current measuring arrangement is not used. Instead, the hall effect measuring scheme is employed. Use of an AC motor in the electrically powered device 61 allows for either the hall effect or inductive based current measuring arrangement to be employed.

Although described as employing either an inductive based current measuring arrangement or a hall effect based current measuring arrangement, it is to be understood that other current measuring arrangements may be employed in accordance with other exemplary embodiments of the device 10. The device 10 may be capable of measuring the amount of current passed through the conductor 12 which may then be attributed to the amount of current supplied to the electrically powered device 61. The sensor is generally indicated at reference number 46 and may be variously configured and include various components. Further, the sensor 46 may be capable of performing the necessary calculations and displaying the necessary data to the user with respect to the measured readings and settings. Alternatively, the data from the sensor 46 can be sent to other components of the device 10 as will be momentarily discussed for processing, storage, or display.

The device 10 may measure the current passing through the conductor 12 in order to ascertain the total operating time of the electrically powered device 61. In this regard, the device 10 may track the amount of time current runs through the conductor 12 to in effect track the amount of time the electrically powered device 61 is in operation. The total operating time may be provided to service personnel so that appropriate repairs or servicing may be conducted that are based upon the actual amount the electrically powered device 61 has been run.

The device 10 may also be capable of measuring the average operating time of the electrically powered device 61. The average operating time may be the average amount of time the electrically powered device 61 is run between being turned on and being turned off. Hence, the average operating time may be the amount of time, on average, that the electrically powered device 61 runs when between power on and power off. The average operating time may be calculated based upon tracking the current flowing to the electrically powered device 61 and the time the current is recorded. Multiple measurements over various on/off cycles can be taken to arrive at an average. This parameter may be supplied to the service personnel so that an appropriate service procedure or repair may be made as required.

The device 10 may also be capable of recording the number of start/stop events. In this regard, the device 10 can track the number of times the electrically driven device is started and stopped. This measurement may be accomplished by making note of the current passing through the conductor 12. The number of start/stop events may be conveyed to the user and a service or repair may be made taking into account this information.

The device 10 may also be capable of noting the peak current imparted onto the electrically driven device. The peak current may be the highest current ever recorded by the device 10 through the conductor 12 or may be the average peak current observed through the number of start/stop cycles recorded. The peak current can be measured in amps and provided to the user in this form. Alternatively, the peak current may be provided in a threshold form so that the user is informed that the current exceeded a particular threshold but is not informed of the actual measured value. An appropriate repair may be made to the electrically driven device based upon the peak current reading of the device 10.

The average current may also be calculated and provided by the device 10. The average current may be the average current measured over the entire time the electrically driven device is in operation. The device 10 may thus measure the amount of current and the times the current is being provided in order to arrive at an average. Alternatively, average current measurements may also be provided for various start/stop cycles. The average current measurements may be used by service personnel to make an appropriate repair or maintenance procedure.

Knowledge of the aforementioned parameters associated with the electrically driven device may allow service personnel to more easily diagnose problems associated therewith. Also, knowledge of the previously mentioned parameters allows one to schedule routine maintenance and perform appropriate repairs as enhanced knowledge of the functioning and stresses imparted onto the electrically driven device is known. As used herein, the magnitudes, averages, or other parameters may be either positive or negative and thus such a reporting system is at the discretion of the user or manufacturer of the device 10.

The device 10 can be a completely self-contained assembly in that a separate computer is not required to obtain data from the device 10 or to program the device 10. A battery 28 may be carried by the device 10 and can be used to power the various components of the device 10. The device 10 can include a microcontroller 30 to process input obtained from the current sensor of the device 10 and convert same into a current, average, or on/off indication as previously discussed. The user may be notified of the output of the device 10 by way of a display 24 that can be an LCD screen. The device 10 may also include one or more pushbuttons 26 for use in programming the device 10. The pushbuttons 26 can be used to set certain threshold parameters of the device 10, reset one or more of the measured parameters, cycle through data recorded and stored by the microcontroller 30, or to configure a time to service period. In this regard, the user may set an alarm to occur when a particular peak current, average current, run time, or other measured parameter is met. Once the alarm occurs, the user may then make the appropriate repair or servicing of the electrically driven device.

The device 10 may thus include a time-to-service indicator and/or an alarm. The indicator may be set to indicate a service time based upon any of the parameters previously listed. The alarm may sound when a particular parameter exceeds a preset threshold, thresholds, or combination of one or more thresholds. The threshold may be set by the operator though the use of the pushbuttons 26 or may be preprogrammed into the microcontroller 30. The microcontroller 30 may be configured to include the functionality of an alarm and/or indicator or an additional component can be included in the device 10 to achieve this result. The device 10 may be arranged so that battery 28 life is conserved. In this regard, the LCD screen 24 may not be turned on if current is not being sensed by the device 10 through the conductor 12. Also, the LCD screen 24 may not be activated until a pushbutton 26 is depressed by a user to specifically request a certain measured value or setting.

Certain electrically powered devices 61 such as those found in an industrial environment typically have the necessary conductor 12 exposed and available to the user for placement of the device 10 thereon. However, other electrically powered devices 61 such as those found in residential settings like lamps and refrigerators do not have a conductor 12 readily available. In this regard, the neutral, line/hot, and ground wires are placed against one another and formed into a single line that may run from a wall outlet to an interior power box or motor of the electrically powered device 61. In this type of arrangement, the device 10 will not function properly if it is placed around all three of the combined wires. In order to function properly, the device 10 must be placed around either the neutral line or the line/hot line. The device 10 will not work correctly if placed around the ground line. The user may thus modify the wiring of the electrically powered device 61 to obtain a proper conductor 12 around which the device 10 may be attached.

Figure 3:
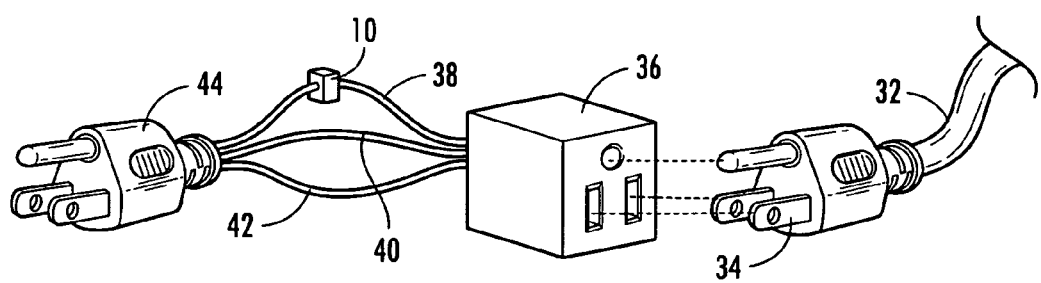
FIG. 3 is a perspective view of an electrical monitoring device incorporated for use with a typical residential electrical device in accordance with one exemplary embodiment.

FIG. 3 illustrates an arrangement in which the device 10 may be incorporated into a standard wiring arrangement of a typical residential appliance or article. Here, the wire 32 from the electrically powered device 61 terminates in a standard three prong male fitting 34. A female fitting 36 may be provided into which the three prong male fitting 34 may be received. Three separate wires 38, 40 and 42 extend from the female fitting 36 and are physically separated from one another. Wire 38 may be neutral, wire 40 may be hot or line, and wire 42 may be a ground wire. The device 10 can be attached to the neutral wire 38 in the manner previously indicated. Here, the device 10 is not attached to the line or hot wire 40 or to the ground wire 42. Alternatively, the device 10 may be attached to the hot or line wire 40 and not to the wires 38 or 42. The device 10 will function properly to read current flowing through the wire 32 as the wire 38 or 40 to which it is connected acts as a conductor 12. The three wires 38, 40 and 42 end in a male fitting 44 that has three prongs that may be inserted into a standard wall outlet. Although shown as employing a splitter arrangement to provide functionality to the device 10, it is to be understood that a splitter is not needed for the device 10 to work with residential electrically powered devices 61 in accordance with other exemplary embodiments.

Figure 8:
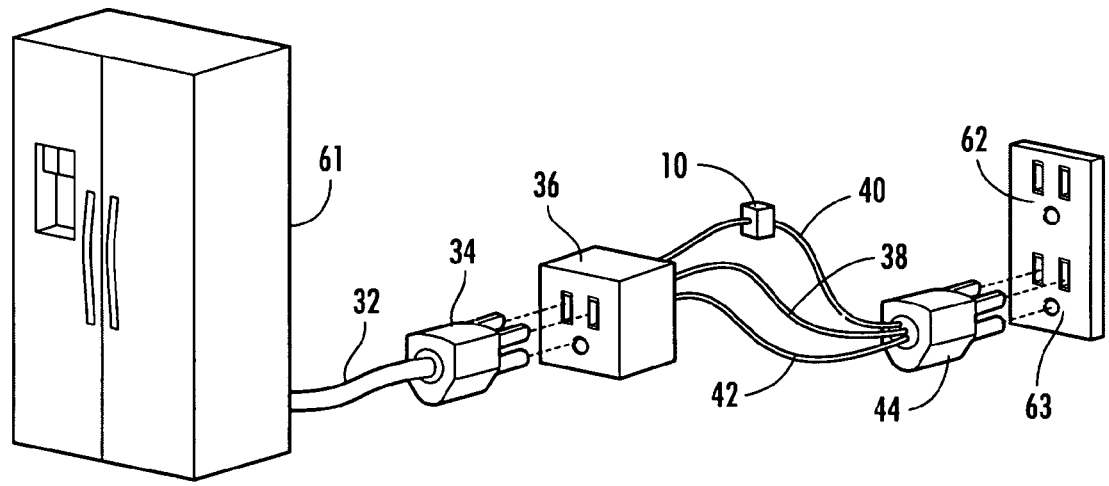
FIG. 8 is a perspective view of an electrical monitoring device incorporated for use into an appliance of a residence in accordance with one exemplary embodiment.

FIG. 8 illustrates another exemplary embodiment of the device 10 as incorporated into a household application. An appliance 61 that may be for instance a refrigerator has a wire 32 that terminates in a standard three prong fitting. A corresponding female fitting 36 can be attached to the wire 32 and may include a neutral wire 38, hot or line wire 40, and ground wire 42 extending therefrom as discussed previously. The device 10 is attached to the hot or line wire 42 in order to make current measurements. The wires 38, 40 and 42 are in communication with a male fitting 44 that is attached to a standard household wall outlet 62. The refrigerator 61 may be powered through communication with the wall outlet 62 and the device 10 can be used by the homeowner to monitor the refrigerator 61. Although shown as a refrigerator, it is to be understood that the appliance 61 may be an oven, washer, dryer, toaster, television, or any other household or commercial item in accordance with other exemplary embodiments. Although described as an appliance, the electrically powered device 61 need not be an appliance in other exemplary embodiments and may thus be variously configured.

The device 10 can thus be attached by a user without the need to interrupt the electrical circuit of the electrically powered device. An electrical connection is not necessary other than simply clamping the device 10 onto the appropriate conductor 12. Although shown as employing a pivoting type arrangement, it is to be understood that the device 10 can be variously arranged in accordance with other exemplary embodiments. For example, the device 10 may employ a vice-like connection to cause attachment of the device 10 to the conductor 12.

The device 10 may be arranged so that it is not a part of an electrical circuit of the electrically powered device 61. The electrically powered device 61 may be operated completely independently of the device 10 so that attachment and removal of the device 10 to the conductor 12 has no effect on the functioning of the electrically powered device 61 or on the current or other power supplied to the electrically powered device 61 from a power source 63. As such, the electrically powered device 61 does not sense the presence of the device 10 and its functioning is not effected by the presence or removal of the device 10 from the conductor 12.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed:

1. An electrical monitoring device for monitoring an electrically powered device, comprising:

a frame for placement onto a conductor of the electrically powered device;

a sensor for detecting the amount of current passing through the conductor; and a display for indicating to the user parameters of the electrically powered device that are indicative of the current passing through the conductor, wherein the parameters comprising:

total operating time of the electrically powered device that is the total amount of time current has passed through the conductor;

average operating time of the electrically powered device that is the amount of time on average that current has passed through the conductor between starting and stopping of the current through the conductor;

number of start/stop events that is number of times current has started and then stopped passing through the conductor;

peak current that is the peak magnitude of the current passing through the conductor; and average current that is the average magnitude of the current passing through the conductor.

2. The electrical monitoring device as set forth in claim 1, wherein the peak current is the highest current magnitude ever detected by the sensor.

3. The electrical monitoring device as set forth in claim 1, wherein the peak current is the average of the highest peak current magnitudes present in each of the start/stop events.

4. The electrical monitoring device as set forth in claim 1, wherein the average current is the average magnitude of current passing through the conductor ever detected by the sensor.

5. The electrical monitoring device as set forth in claim 1, wherein the average current is the average of the average magnitude of current passing through the conductor in each of the start/stop events as detected by the sensor.

6. The electrical monitoring device as set forth in claim 1, wherein the frame has a first half and a second half that are hinged to one another, wherein the first half has a handle portion and a forward portion, wherein the second half has a handle portion and a forward portion, wherein the forward portions engage the conductor, wherein the sensor is arranged as a transformer such that the conductor is a first winding of the transformer and such that the forward portions are the core of the transformer, and such that a second winding engages at least one of the forward portions.

7. The electrical monitoring device as set forth in claim 6, wherein the second winding contacts the forward portion of the first half and the conductor, and wherein the second winding does not contact the forward portion of the second half.

8. The electrical monitoring device as set forth in claim 6, wherein the second winding contacts the outer surfaces of the forward portions of both the first half and the second half, and wherein the second winding is not located between the forward portion of the first half and the forward portion of the second half.

9. The electrical monitoring device as set forth in claim 1, wherein the sensor is a hall effect sensor.

10. The electrical monitoring device as set forth in claim 1, wherein the electrically powered device is an appliance of a homeowner that has a wire that terminates in a three prong male fitting; and further comprising:

a second three prong male fitting;

a female fitting;

a neutral wire extending from the second three prong male fitting to the female fitting;

a hot wire extending from the second three prong male fitting to the female fitting; and a ground wire extending from the second three prong male fitting to the female fitting;

wherein the conductor is either the neutral wire or the hot wire and the frame is placed onto either the neutral wire or the hot wire that is the conductor.

11. An electrical monitoring device for monitoring an electrically powered device, comprising:

a frame for placement onto a conductor of the electrically powered device;

a sensor for detecting the amount of current passing through the conductor; and a microcontroller for calculating parameters of the electrically powered device based upon the current passing through the conductor, wherein the parameters consisting of:

total operating time of the electrically powered device;

average operating time of the electrically powered device;

number of start/stop events of the electrically powered device;

peak current of the electrically powered device; and average current of the electrically powered device.

12. The electrical monitoring device as set forth in claim 11, wherein the microcontroller generates an alarm signal when two of the five parameters exceed a threshold value.

13. The electrical monitoring device as set forth in claim 11, wherein the sensor is independent of an electrical circuit of the electrically powered device so as not to form a part of the electrical circuit of the electrically powered device, and wherein the frame is releasably attachable to the conductor such that placement onto and off of the conductor does not interfere with the transmission of power to the electrically powered device.

14. An electrical monitoring device for monitoring an electrically powered device, comprising:

a frame for placement onto a conductor of the electrically powered device;

a sensor for detecting the amount of current passing through the conductor; and a microcontroller for calculating parameters of the electrically powered device based upon the current passing through the conductor, wherein the parameters comprising:

total operating time of the electrically powered device that is the total amount of time current has passed through the conductor;

average operating time of the electrically powered device that is the amount of time on average that current has passed through the conductor between starting and stopping of the current through the conductor;

number of start/stop events that is number of times current has started and then stopped passing through the conductor;

peak current that is the peak magnitude of the current passing through the conductor; and average current that is the average magnitude of the current passing through the conductor;

wherein the frame is capable of being attached to and removed from the conductor during operation of the electrically powered device without disrupting functioning of the electrically powered device and without disrupting current supplied through the conductor from a power source to the electrically powered device.

15. The electrical monitoring device as set forth in claim 14, wherein the power source is a wall outlet in a residence, and wherein the electrically powered device is an appliance of the residence.

\* \* \* \* \*